United States Patent [19]

Sigworth et al.

[11] Patent Number: 5,940,570
[45] Date of Patent: Aug. 17, 1999

[54] COMPOSITION FOR ENCAPSULATING SIGNAL TRANSMISSION DEVICES

[75] Inventors: William Davis Sigworth, Naugatuck; Thomas Harald Peter, Oxford, both of Conn.

[73] Assignee: Uniroyal Chemical Company, Inc., Middlebury, Conn.

[21] Appl. No.: 08/907,576

[22] Filed: Aug. 8, 1997

Related U.S. Application Data

[62] Division of application No. 08/655,495, May 30, 1996, Pat. No. 5,698,631.

[51] Int. Cl.$^6$ .......................... G02B 6/24; B32B 15/08; H02G 15/04
[52] U.S. Cl. .......................... 385/139; 385/128; 174/76; 428/378; 525/122; 528/110; 528/122; 528/295.5
[58] Field of Search ..................... 385/139, 128; 174/76; 428/378; 525/122; 528/110, 122, 295.5

[56] References Cited

U.S. PATENT DOCUMENTS

| | | | |
|---|---|---|---|
| 2,633,458 | 11/1953 | Shokal | 528/109 |
| 2,824,083 | 2/1958 | Parry et al. | 528/110 |
| 3,281,491 | 10/1966 | Smith et al. | 528/110 |
| 3,576,781 | 4/1971 | Hicks | 528/110 |
| 3,897,514 | 7/1975 | Allabashi | 528/110 |
| 4,156,700 | 5/1979 | Tremblay et al. | 525/122 |
| 5,140,069 | 8/1992 | Mulhaupt et al. | 528/110 |

OTHER PUBLICATIONS

Lee et al., "Handbook of Epoxy Resins", McGraw–Hill Book Co., pp. 11/2–11/8 (Reissue 1982).

*Primary Examiner*—Donald R. Wilson
*Attorney, Agent, or Firm*—Daniel Reitenbach

[57] ABSTRACT

A method for encapsulating segments of signal transmission devices such as splices, pressure blocks and end blocks with a room-temperature curable composition comprising:

(1) a hydroxy-functional compound having a molecular weight of greater than 500 and a hydroxy functionality of 2 or more;

(2) an epoxy-functional compound having an epoxy functionality of 2 or more; and (3) a curative catalyst, in an amount effective to crosslink the epoxy and hydroxy components of the respective epoxy-functional and hydroxy-functional compounds.

10 Claims, No Drawings

COMPOSITION FOR ENCAPSULATING SIGNAL TRANSMISSION DEVICES

This is a division of application Ser. No. 08/655,495, filed May 30, 1996 now U.S. Pat. No. 5,698,631.

TECHNICAL FIELD

This invention relates to a composition useful for encapsulating signal transmission devices. More particularly, this invention relates to a composition comprising a multi-functional epoxy component, a multi-functional hydroxy component, and a curative catalyst.

BACKGROUND OF THE INVENTION

Telecommunication cable is frequently employed in situations where water is able to enter and migrate thoughout the cable system. Water entry into either metallic and fiber-optic cables is undesirable because such entry leads to corrosion and deterioration of desired transmission properties, particularly at the sites where the cables are spliced together.

To protect such cable systems, it has become common practice to encase certain cable segments by a closure that functions as an extension of the cable sheath or cover.

In addition, it has become common practice to encapsulate such cable segments with a curable encapsulant, in order to prevent water migration. Examples of cable segments typically placed in closures and so encapsulated include areas where two or more cables are spliced together, at the ends of cable, junctions between air-pressurized cable and grease-filled cable, and pressure blocks.

It is often necessary for the encapsulant to be re-enterable for repair or other modification. For an enclosure to be re-enterable, the encapsulant must be capable of being entirely removed from around the splice area in a simple manner (such as by hand), because it is not desirable to use tools or other implements near copper wire, optic filament, or delicate parts. In this way, wire and filament connections are not damaged, and copper wire insulation as well as fiber-optic coatings are not disturbed.

Because the splice closures for telecommunication devices are typically encapsulated at field locations where cable is layed, the encapsalants are applied by a variety of individuals under a variety of conditions. It is desirable, therefore, to have a clear, easy to mix, two-part system where adequate mixing can be readily determined from the color change of the system. Sufficient mixing is necessary to obtain high quality splices. Clarity of the encapsalant aids in observation of both the filling process and eventual re-entry process.

Encapsulants of this type are often required to is provide acceptable adhesion to grease, because electrical and telephone cables typically contain a number of individual conductors that are often covered with grease as protection from water penetration. U.S. Pat. No. 4,176,240 describes a grease composition which is typical of the types used as water-proofing agents in electrical and telephone cables.

Urethanes which are made by reacting a polyol with an isocyanate, such as those described in U.S. Pat. Nos. 4,375,521; 4,596,743; and 4,666,968, have been described as useful for encapsulation of telecommunication equipment and devices include urethanes.

Urethanes have numerous drawbacks. Urethanes are inherently tough, resilient materials, which renders them inherently difficult to re-enter. Compatability with hydrocarbon-based greases is also poor for urethanes, as is adhesion to grease-coated conductor wires.

In an alternative method of curing polyols, hydroxy-containing compounds are reacted stoichiometrically with maleic anhydride-modified polybutadiene to form thermosetting ester compounds. Organic amines, phosphines and/or organometallic soaps are used to catalyze these esterification reactions. For example, U.S. Pat. Nos. 4,857,563; 4,985,475; and 5,169,716, describe encapsulant compositions which are extended reaction products of an admixture of an anhydride-functionalized composition and a crosslinking agent. Such encapsulants are, however, very difficult to re-enter and adhere poorly to grease-coated wires. The ester linkages formed in these encapsulants are also susceptible to hydrolytic cleavage.

U.S. Pat. No. 5,140,075 describes an encapsulation composition consisting of a low molecular weight epoxy-grafted polymer and a curative. This composition results in a material that is opague, making observation of filling and re-entry more difficult.

It is an object of the present invention to provide a room-temperature curable composition which can be used as a durable encapsulant for signal transmission devices, wherein the encapsulant is easily re-enterable, possesses a high degree of transparency and clarity, is capable of protecting the signal transmission devices from water and other external damage, and has excellent adhesion to grease-coated conductor wires.

SUMMARY OF THE INVENTION

This invention relates to a room temperature curable composition comprising: (1) an epoxy-functional compound having an epoxy functionality of two or more; (2) a hydroxy-functional compound having a molecular weight of greater than 500 and a hydroxy functionality of two or more; and (3) a curative catalyst, in an amount effective to crosslink the epoxy and hydroxy components of the epoxy-functional and hydroxy-functional compounds.

This invention relates to a method for encapsulating a signal transmission device using such a composition.

This invention additionally relates to an encapsulated signal transmission device prepared by such a method.

DETAILED DESCRIPTION OF THE INVENTION

For the purposes of this invention, the term "epoxy-functional compound" means a chemical compound comprising at least one three membered ether ring (epoxy group) of the structure

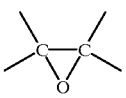

The term "multi-functional epoxy compound" means an epoxy-functional compound comprising an average of two or more epoxy groups per molecule. The multi-functional epoxy compound is present in the instant composition in an amount of about 5% (w/w) to about 98% (w/w), preferably, 10% (w/w) to about 60% (w/w), and, more preferably, 30% (w/w) to about 50% (w/w), of the total mixture of the multi-functional epoxy compound and the multi-functional hydroxy compound (excluding diluents). Useful multi-functional epoxy compounds include epoxidized olefinically unsaturated natural oils, epoxidized unsaturated esters, aromatic glycidyl ethers, aliphatic glycidyl ethers, epoxidized olefinically unsaturated polymers, and glycidyl ether functional polymers, and the like, as well as combinations thereof.

A preferred multi-functional epoxy compound useful in the composition of this invention, is an epoxidized soybean oil (such as Flexol EPO, available from Union Carbide).

For the purposes of this invention, the term "hydroxy-functional compound" means a chemical compound comprising at least one functional group (hydroxy group) of the structure

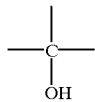

The term "multi-functional hydroxy compound" means a hydroxy-functional compound comprising an average of two or more hydroxy groups per molecule. The multi-functional hydroxy compound is present in the instant composition in an amount of about 2% (w/w) to about 95% (w/w), preferably, about 40% (w/w) to about 90% (w/w), and, more preferably, 50% (w/w) to about 70% (w/w), of the total mixture of the multi-functional epoxy compound and multi-functional hydroxy compound (excluding diluents).

Suitable multi-functional hydroxy compounds include hydroxy-terminated polybutadiene (e.g., Poly bd R45HT, Elf Atochem, Philadelphia, Pa.), hydroxy-terminated polybutadienestyrene, hydroxy-terminated polybutadiene-acrylonitrile, hydroxy-functionalized ethylene-propylene copolymers and terpolymers, hydroxy-functionalized polyisoprene, castor oils (e.g., Caschem DB oil, Caschem, Bayonne, N.J.), as well as commercially-available polyether polyols, polyester polyols, and the like, and combinations thereof.

For the purposes of this invention, the term "curative catalyst" means a chemical compound or mixture of chemical compounds which will cause the mixture of the multi-functional epoxy compound and multi-functional hydroxy compound, to form a cross-linked network.

The amount of curative catalyst which can be employed will vary in accordance with a number of factors including the particular curative catalyst that is selected, the degree of epoxidation present on the graft polymers, desired gel time, the degree of cure desired, and so forth. In general, the amount of curative catalyst will vary from about 0.5 parts to about 100 parts, preferably, about 2 to about 50 parts, and most preferably, about 10 to about 30 parts, per 100 parts of the total mixture of the multi-functional epoxy compound and the multi-functional hydroxy compound.

Suitable curative catalysts include acidic catalysts such as those comprising a Lewis acid. For the purposes of this invention, the term "Lewis acid" means compounds having vacant orbitals in the outer shell of at least one of its atoms, thereby being reactive with compounds having a high electron density. Suitable Lewis acids include, e.g., boron trifluoride, tin tetrachloride, aluminum trichloride, aluminum tribromide, zinc chloride, silicon tetrachloride, and ferric chloride, and the like.

A preferred curative catalyst is a catalyst composition comprising: (1) a catalytically effective amount of a Lewis acid, and (2) a titanate having the structure Ti(OR$^1$)(OR$^2$)(OR$^3$)(OR$^4$)

wherein R$^1$, R$^2$, R$^3$ and R$^4$ are each independently alkyl or aryl.

Suitable titanates include tetraisopropyl titanate, tetra-n-butyl titanate, tetraisobutyl titanate, tetra-t-butyl titanate, tetra-2-ethylhexyl titanate, tetra-dodecylphenoxy titanate, tetranonylphenoxy titanate, and diisopropyl dinonylphenoxy titanate, and the like.

Both the molar ratio of titanate to Lewis acid as well as the Lewis acid concentration in the catalyst composition can vary. However, it is generally preferred that the molar ratio of titanate to Lewis acid be in the range of about 0.5–20, more preferably about 0.5–10, and most preferably about 1–6. Also, the Lewis acid concentration in the catalyst will generally be about 0.005–0.1 moles per 100 grams of catalyst composition, more preferably about 0.0075–0.05 moles per 100 grams of catalyst composition, and most preferably, about 0.01–0.03 moles per 100 grams of catalyst composition.

Such catalyst compositions can additionally contain certain additives as well as certain diluents, well known to a person having ordinary skill in the art. Suitable additives include esters based on natural-product oils as well as esters based on hydrocarbon oils. Suitable diluents, which can either be reactive or nonreactive, include dioctyl azelate and octyl tallate, in an amount that is effective for increasing pourability.

The composition of this invention can further include cure accelerators, in order to decrease their gelling or setting time. Any of the commercially-known epoxy-cure accelerators may be employed, provided that they are compatible with the end product and its intended use. Preferred accelerators include alkylphenols such as nonylphenol, dodecylphenol, and the like.

Preferred amounts of accelerator utilized will depend upon a variety of factors, including the particular catalyst which is selected, the amount of epoxy-functionality that is present, the amount and type of curative that is employed, and so forth.

For the purposes of this invention, the term "signal transmission device" means a device for transmitting a pulsed or modulated signal from one location to another. Examples of signal transmission devices which can be encapsulated by the compositions of this invention include copper telecommunications cable, fiber optic telecommunications cable, and CATV cable.

Because of its ability to cure at room temperature, the compositions of this invention are well-suited for such on-site encapsulation of cable segments as splices, pressure blocks, and end blocks.

One method for encapsulating a telecommunication cable segment using the composition of this invention is described below. The telecommunication cable segment can be of the metallic type or the fiber-optic type. The telecommunication cable segment is placed within a closure. Such a closure serves to act (at least in part) as a retainer for the composition of this invention. The closure can generally be of any useful configuration or composed of any useful material.

The composition of this invention is typically then prepared by combining a mixture of the multi-functional epoxy compound and the multi-functional hydroxy compound, with the curative catalyst. The resultant composition can be suitably mixed by any means effective to disperse adequately the curative catalyst within the mixture, in a manner such that curing will occur.

This composition is then poured into the closure such that the composition covers at least that portion of the cable segment to be protected.

Such pouring can be accomplished at any temperature which is below the decomposition temperature of the composition and which will not cause damage to the cable segment to be protected, preferably at room temperature or at moderately-elevated temperatures.

The composition of this invention can be easily adapted for on-site repairs due to the ease of application. Moreover, the composition of this invention exhibits excellent adhesion to wire.

The improved compatibility of the compositions of this invention with cable filler as well as improved conductor wire-adhesion properties of the compositions of this invention can prevent or greatly reduce the frequency of water corrosion related failures.

Should future re-entry be necessary, the advantageous re-entry characteristics of the encapsulant produced from the composition of this invention, allows changes to be made with minimum risk of damage to other conductors.

The following examples are presented to illustrate the present invention.

EXAMPLE 1
Preparation of Lewis Acid Catalysts Regulated With Alkyl Titanates Eight hundred and seventy-eight grams (878 g) of octyl tallate (commercially-available from CP Hall of Akron, Ohio, as Plasthall 100, a diluent used to adjust catalyst viscosity) was weighed into a one-gallon Pyrex jar. 1,357 g of dodecyl phenol was then added into the jar, with stirring, to form a light yellow solution. 585 g of tetraethylhexyl titanate was subsequently slowly added to the light yellow solution in the jar, with stirring.

Addition of the titanate liberated heat and produced a dark red solution, indicative of the formation of tetradodecyl phenolatotitanate.

Finally, 180 g of anhydrous tin tetrachloride was added to the dark red solution in the jar, with the liberation of heat, and the resultant mixture was rolled overnight on a roller mill to ensure uniformity of the mixture, to produce Sn/Ti Catalyst 1A.

A second catalyst (Sn/Ti Catalyst 1B) was prepared in a similar manner as Sn/Ti Catalyst 1A, using 828 g Plasthall 100, 749 g dodecyl phenol, 323 g tetraethylhexyltitanate, and 99.5 g tin tetrachloride.

EXAMPLE 2 AND COMPARATIVE EXAMPLES A–C
Preparation of Encapsulant Compositions To prepare the composition of Example 2, 100 g of Polybutadiene R45HT (Elf Atochem NA), a hydroxy-functionalized polybutadiene liquid elastomer having 2.3 hydroxy groups per chain and a molecular weight of 2800, was weighed into a beaker. 20 g of Paraplex G-60 Epoxy (CP Hall), an epoxidized soybean oil having 4.4 epoxy groups per chain and a molecular weight of 1000, was then added to the Polybutadiene R45HT in the beaker. Finally, 20 g of the Sn/Ti Catalyst 1A prepared in Example 1 above, was added to the mixture of Polybutadiene R45HT and Paraplex G-60 Epoxy in the beaker, to produce the composition of Example 2. Addition of the catalyst was carried out with stirring but with no added heat, because the reaction was exothermic.

The composition of Comparative Example A was prepared as described above for the composition of Example 2 except that no catalyst was used. The composition of Comparative Example B was prepared as described above for the composition of Example 2 except that no Paraplex G-60 Epoxy was used. The composition of Comparative Example C was prepared as described above for the composition of Example 2 except that no Polybutadiene R45HT was used.

A wooden stick was then dipped (frequently) into each composition until the composition exhibited a tendency to snap back. The time from mixing to snap-back condition was considered the gel time. The recipes for the compositions of Example 2 and Comparative Examples A, B and C, as well as the physical properties of each cured composition, are listed below in Table I.

In Table I and the other tables presented below, the following procedures were used for physical tests and sample preparation.

Procedures For Physical Testing And Sample Preparation

To prepare a sample, 35 grams of the composition to be tested was poured into an aluminum cup, 76 millimeters (3 inches) in diameter by 15.9 millimeters (⅝ inches) deep, which had previously been sprayed with a commercially available mold-release product. Depending upon the composition being tested, the sample was then cured either at room temperature in a dessicator or at elevated temperature in a circulating-air oven. Final cured sample thickness was 9.5 millimeters (⅜ inches).

Regarding our determination of cure properties, the cure state thus determined was a qualitative assessment. The durometer value of the cured sample was measured using a Shore 00 type durometer, which was attached to a mounting rod. An 800 gram weight was placed on top of the durometer mounting rod. Measurements were taken 15 seconds after the durometer's probe was placed on the sample surface.

To determine sample elongation, a 12.7 millimeter (½ inch) wide strip was cut from the center of the cured material and a 12.7 millimeter (½ inch) gage mark placed in the center of the strip. The strip was then put into a jig and extended at a rate of 254 millimeters (10 inches) per minute. A ruler was held along the side of the sample during extension to determine the elongation at break.

TABLE I

| Example | A | B | C | 2 |
|---|---|---|---|---|
| Polybutadiene R45HT | 100 | 100 | — | 100 |
| Paraplex G-60 Epoxy | 20 | — | 20 | 20 |
| Sn/Ti Catalyst 1A | — | 20 | 20 | 20 |
| Gel Time @ RT | >5 hr. | >5 hr. | 10 sec. | 11 min. |
| Cured Properties | | | | |
| Cured State | No Cure | No Cure | Crumbled | Flexible |
| 00 Durometer | — | — | N/T | 36 |
| Elongation at Break | — | — | <25% | 50–75% |

Example 2 together with Comparative Examples A and B demonstrate that a multi-functional epoxy compound, a multi-functional hydroxy, and a curative catalyst are needed to produce an acceptable cured product.

EXAMPLES 3–5 AND COMPARATIVE EXAMPLES D–I

Following the procedure described in Example 2 and Comparative Examples A–C above, the compositions of Examples 3–5 and Comparative Examples D–I were prepared, cured and evaluated using the multi-functional hydroxy compounds listed in Table II below.

TABLE II

| | |
|---|---|
| Comparative Examples D, E and F | Polypropylene Glycol (PPG) Molecular Weight 425 |
| Comparative Examples G and H and Example 3 | PPG Molecular Weight 1000 |
| Comparative Example I and Example 4 | PPG Molecular Weight 2000 |
| Example 5 | Polytetramethylene Ether Glycol, MW 1000 (PTMEG-1000) |

The multi-functional epoxy compound used in Examples 3–5 and Comparative Examples D–I was Paraplex G-60 Epoxy and the curative catalyst was Sn/Ti Catalyst 1A.

Tables III and IV below describe gel time, summarize the properties of the multi-functional hydroxy compounds, and display the cured properties of the compositions.

Data in Tables III and IV demonstrate that the polyol-substituted multi-functional hydroxy compounds (hereinafter "polyols") having a molecular weight greater than 500 produce useful compositions.

Polyols most preferred have a molecular weight that ranges from 1000–4000. These experiments also tend to show that the amount of multi-functional epoxide needed to cure the polyol is dependent upon the polyol molecular weight. That is, lower molecular weight polyols require more epoxide. Required epoxide ranges from 5–50% of the polyol-epoxide mixture. A range of 10–50% of the polyol-epoxide mixture is preferred, and 17–50% of the polyol-epoxide mixture is most preferred.

TABLE III

| Comp. Example | D | E | F | G | H | I |
|---|---|---|---|---|---|---|
| PPG-425 | 83 | 70 | 50 | — | — | — |
| PPG-1000 | — | — | — | 83 | 70 | — |
| PPG-2000 | — | — | — | — | — | 83 |
| PTMEG-2000 | — | — | — | — | — | — |
| Paraplex G-60 | 17 | 30 | 50 | 17 | 30 | 17 |
| Sn/Ti Catalyst 1A | 17 | 17 | 17 | 17 | 17 | 17 |
| Polyol Properties | | | | | | |
| Type | Ether | Ether | Ether | Ether | Ether | Ether |
| Functionality | 2 | 2 | 2 | 2 | 2 | 2 |
| MW | 425 | 425 | 425 | 1000 | 1000 | 2000 |
| Gel Time @ RT | >3 hr. | >20 hr. | >20 hr. | >3 hr. | >20 hr. | 3 hr. |
| Cured Properties | | | | | | |
| Cured State | No Cure | No Cure | No Cure | No Cure | Partial | No Cure |
| 00 Durometer | — | — | — | — | — | — |
| Elongation at Break | — | — | — | — | — | — |

TABLE IV

| Examples | 3 | 4 | 5 |
|---|---|---|---|
| PPG-425 | — | — | — |
| PPG-1000 | 50 | — | — |
| PPG-2000 | — | 70 | — |
| PTMEG-2000 | — | — | 50 |
| Paraplex G-60 | 50 | 30 | 50 |
| Sn/Ti Catalyst 1A | 17 | 17 | 17 |
| Polyol Properties: | | | |
| Type | Ether | Ether | Ether |
| Functionality | 2 | 2 | 2 |
| MW | 1000 | 2000 | 1000 |
| Gel Time @ RT | 105 minutes | 43 minutes | 90 minutes |
| Cured Properties: | | | |
| Cured State | Brittle | Brittle | Brittle |
| 00 Durometer | 59 | 53 | 80 |
| Elongation at Break | <25% | <25% | <25% |

EXAMPLES 6–9 AND COMPARATIVE EXAMPLES J–L

Following the procedure described in Example 2 and Comparative Examples A–C above, the compositions of Examples 6–9 and Comparative Examples J–L were prepared, cured and evaluated using the compounds listed below in Table V.

TABLE V

| | |
|---|---|
| Hydroxy Functional | Polyethylenebutylene Adipate Glycol of molecular weight 1000 (PEBAG-1000) |
| | Polybutadiene R45HT (as in Example 2) |
| | Pentaerythritol monoricinolate (Caschem, Inc) |
| Epoxy Functional | Paraplex G-60 (as in Example 2) |
| Curative Catalyst | Sn/Ti Catalyst 1A |

Tables VI and VII below describe gel time, summarize the properties of the multi-functional hydroxy compounds and display the cured properties of the compositions of Examples 2 and 6–9 and Comparative Examples J–L These examples show that the compositions of the present invention can comprise a wide variety of multi-functional hydroxy compounds including hydroxy-functional butadiene, polyether polyols, polyester polyols, and hydroxylated natural oils such as castor oil.

Multi-functional hydroxy compounds of molecular weight in excess of 500 produce useful encapsulant compositions. Multi-functional hydroxy compounds having molecular weights ranging from about 1000 to about 4000 are preferred.

The examples of Tables VI and VII also show that the amount of multi-functional epoxy compound needed to cure the multi-functional hydroxy compound is dependent on the molecular weight of the multi-functional hydroxy compound.

The examples of Tables VI and VII demonstrate that a particularly useful amount of the multi-functional epoxy compound can range from about 5–50% by weight, preferably, 10–50% by weight, and more preferably, 17–50% by weight, of the resultant mixture of the multi-functional expoxy compound and the multi-functional hydroxy compound.

TABLE VI

| Comparative Examples | J | K | L |
|---|---|---|---|
| PEBAG-1000 | 83 | — | — |
| Polybutadiene R45HT | — | 95 | — |
| Flexricin 17 | — | — | 50 |
| Paraplex G-60 | 17 | 5 | 50 |
| Sn/Ti Catalyst 1A | 17 | 17 | 17 |

TABLE VI-continued

| Comparative Examples | J | K | L |
|---|---|---|---|
| Polyol Properties | | | |
| Type | Ester | Polymeric | Pentaerothitol Monoricinoleate |
| Functionality | 2 | 2.3 | 4 |
| MW | 1000 | 2800 | 416 |
| Gel Time @ RT | >3 hr. | 2–18 hr. | >2 hr. |
| Cured Properties | | | |
| Cured State | No Cure | Thick Gel | No Cure |
| 00 Durometer | — | Poor | — |
| Elongation at Break | — | Cure | — |

TABLE VII

| Examples | 2 | 6 | 7 | 8 | 9 |
|---|---|---|---|---|---|
| PEBAG-1000 | — | 50 | — | — | — |
| Polybutadiene R45HT | 83 | — | 90 | 50 | — |
| DB Oil | — | — | — | — | 50 |
| Paraplex G-60 | 17 | 50 | 10 | 50 | 50 |
| Sn/Ti Catalyst 1A | 17 | 17 | 17 | 17 | 17 |
| Polyol Properties | | | | | |
| Type | Polymeric | Ester | Polymeric | Polymeric | Glyceryl Tricinoleate |
| Functionality | 2.3 | 2.0 | 2.3 | 2.3 | 3 |
| MW | 2800 | 1000 | 2800 | 2800 | 942 |
| Gel Time @ RT | 11 min. | 15 min. | 61 min. | 2 min. | 13 min. |
| Cured Properties | | | | | |
| Cured State | Flexible | Limited Flexibility | Flexible | Brittle | Brittle |
| 00 Durometer | 36 | 78 | 24 | 87 | 83 |
| Elongation at Break | 50–75% | 25% | 100% | <25% | <25% |

EXAMPLES 10–15 AND COMPARATIVE EXAMPLES M AND N

Following the procedure described in Example 2 and Comparative Examples A–C above, the compositions of Examples 10–15 and Comparative Examples M and N were prepared, cured and evaluated using the multi-functional hydroxy compound, multi-functional epoxy compounds, and curative catalyst, listed below in Table VIII below.

TABLE VIII

| | |
|---|---|
| Hydroxy Functional | Polybutadiene R45HT, a hydroxy-functionalized polybutadiene liquid elastomer (as in Example 2) |
| Epoxy Functional | Paraplex G-60, epoxidized soybean oil (as in Example 2) |
| | Flexol LOE, epoxidized linseed oil (Union Carbide) |
| | Monoplex S-73, epoxidized octyl tallate (CP Hall) |
| | Epirez 510, diglycidal ether of bisphenol A (Shell Chemical Company) |
| | Epirez 50727, a proprietary highly-reactive diglycidyl ether (Shell Chemical Co.) |
| | Heloxy 5048, trimethylol propane triglycidylether (Shell Chemical Co.) |
| | Poly BD 600 and 605, olefinic epoxidized polybutadiene with 3.5% and 6.5% oxiraneoxygen, respectively (Elf Atochem N.A.) |
| Curative Catalyst | Sn/Ti Catalyst 1A |

Tables IX and X below describe gel time, summarize epoxy properties and display the cured properties of the compositions of Examples 10–15 and Comparative Examples M and N.

TABLE IX

| Examples | M | N | 2 | 10 | 11 |
|---|---|---|---|---|---|
| Poly BD R45HT | 83 | 50 | 83 | 83 | 83 |
| Paraplex G-60 | — | — | 17 | — | — |
| Flexol LOE | — | — | — | — | — |
| Monoplex S-73 | 17 | 50 | — | — | — |
| Epirez 510 | — | — | — | 17 | — |
| Epirez 50727 | — | — | — | — | 17 |
| Heloxy 5048 | — | — | — | — | — |
| Poly BD 600 | — | — | — | — | — |
| Poly BD 605 | — | — | — | — | — |
| Sn/Ti Catalyst 1A | 17 | 17 | 17 | 17 | 17 |
| Epoxy Properties | | | | | |
| Type | Olefinic | Olefinic | Olefinic | Aromatic Glycidyl | Aromatic Glycidyl |
| Functionality | 1.3 | 1.3 | 4.4 | 2 | 2 |
| MW | 420 | 420 | 1000 | 376 | 620 |
| Gel Time @ RT | >4 hr. | >4 days | 11 min. | ~66 min. | ~64 min. |
| Cured Properties | | | | | |
| Cured State | No Cure | No Cure | Flexible | Flexible | Flexible |
| 00 Durometer | — | — | 36 | 47 | 15 |
| Elongation at Break | — | — | 50–75% | 125% | >200% |

TABLE X

| Examples | 12 | 13 | 14 | 15 |
|---|---|---|---|---|
| Poly BD R45HT | 83 | 83 | 83 | 83 |
| Paraplex G-60 | — | — | — | — |
| Flexol LOE | — | — | — | 17 |
| Monoplex S-73 | — | — | — | — |
| Epirez 510 | — | — | — | — |
| Epirez 50727 | — | — | — | — |
| Heloxy 5048 | 17 | — | — | — |
| Poly BD 600 | — | 17 | — | — |
| Poly BD 605 | — | — | 17 | — |
| Sn/Ti Catalyst 1A | 17 | 17 | 17 | 17 |
| Epoxy Properties | | | | |
| Type | Aliphatic Glycidyl Ether | Olefinic | Olefinic | Olefinic |
| Functionality | 3 | 2.8 | 5 | 5.9 |
| MW | 465 | 1300 | 1300 | 1000 |
| Gel Time @ RT | ~47 min. | ~44 min. | <1 min. | 9 min. |
| Cured Properties | | | | |
| Cured State | Flexible | Flexible | Flexible | Flexible |
| 00 Durometer | 69 | 12 | 17 | 57 |
| Elongation at Break | 50% | 175% | N/T | 50–75% |

These examples demonstrate that an epoxy-functional compound useful in the composition of this invention has two (2) or more epoxy groups per chain.

These examples also demonstrate the use of a wide variety of epoxy-functional compounds in the composition of this invention, including, e.g., epoxidized olefinically unsaturated natural oils, aromatic glycidyl ethers, aliphatic glycidyl ethers, epoxidized olefinically unsaturated polymers, and glycidyl ether functional polymers.

EXAMPLES 16 AND 17

Following the procedure described in Example 2 and Comparative Examples A–C above, the compositions of Examples 16 and 17 were prepared, cured and evaluated using the hydroxy-functional compound, epoxy-functional compounds, and curative catalysts listed below in Table XI.

TABLE XI

| | |
|---|---|
| Hydroxy-Functional | Polybutadiene R45HT, a hydroxy functionalized polybutadiene liquid elastomer (as in Example 2) |
| Epoxy-Functional | Paraplex G-60, epoxidized soybean oil (as in Example 2) |
| Curative Catalyst | BF$_3$ • Etherate (boron trifluoride complex with diethyl ether) (BASF) |
| Curative Catalyst | Ancamine 1170 (proprietary boron trifluoride-amine complex, designed for elevated-temperature cures) (Pacific Anchor Chemical Company) |

Table XII below describes gel time and displays the cured properties of the compositions of Examples 16 and 17.

TABLE XII

| Examples | 16 | 17 |
|---|---|---|
| Poly BD R45HT | 83 | 83 |
| Paraplex G-60 | 17 | 17 |
| BF$_3$ • Etherate | 1.8 | — |
| Ancamine 1170 | — | 17 |
| Gel Time @ RT (Stick Test) | <1 min. | — |
| Gel Time @ 100° C. (Stick Test) | — | <30 min. |
| Cure Conditions | 800 min./RT | 60 min./100° C. |
| Cured State | Flexible | Flexible |
| 00 Durometer | 69 | 0 |
| Elongation at Break | 50–100% | >200% |

These examples demonstrate the use of other types of Lewis acid catalysts such as boron trifluoride complexes in the composition of this invention.

EXAMPLES 18–20

Following the procedure described in Example 2 and Comparative Examples A–C above, the compositions of Examples 18–20 were prepared, cured and evaluated using the multi-functional hydroxy compound, multi-functional epoxy compounds, curative catalyst, and diluents, listed below in Table XIII below.

TABLE XIII

| | |
|---|---|
| Hydroxy Functional | Polybutadiene R45HT, a hydroxy functionalized polybutadiene liquid elastomer (as in Example 2) |
| Epoxy Functional | Paraplex G-60, epoxidized soybean oil (as in Example 2) |
| Curative Catalyst | Sn/Ti Catalyst 1B |
| Diluent | Monoplex S-73, epoxidized octyl tallate (from CP Hall) |
| Diluent | Plasthall 100, octyl tallate (from CP Hall) |
| Diluent | 100 Solvent Neutral Oil, high purity petroleum oil (from Exxon) |

Table XIV below describes gel time and displays the cured properties of the compositions of Examples 18–20.

TABLE XIV

| Examples | 18 | 19 | 20 |
|---|---|---|---|
| Poly Bd R45HT | 59 | 59 | 59 |
| Paraplex G-60 | 41 | 41 | 41 |
| Monoplex S-73 | 70 | — | — |
| Plasthall-100 | 4 | 74 | 4 |
| 100 Solvent Neutral Oil | — | — | 70 |
| Sn/Ti Catalyst 1B | 27 | 27 | 27 |

TABLE XIV-continued

| Examples | 18 | 19 | 20 |
|---|---|---|---|
| Gel Time, Stick Test | 55 min. | 22 min. | 10 min. |
| Cured Properties | | | |
| Cured State | Flexible | Limited Flexibility | Limited Flexibility |
| 00 Durometer | 25 | 55 | 59 |
| Elongation at Break | 50% | 25% | 25% |

These examples demonstrate the use of diluents in the composition of the present invention. Such diluents can include, e.g., epoxy-functionalized or non-functionalized materials.

Examples of useful functionalized materials include epoxidized olefinic natural oils having less than two epoxy groups per chain, monoglycidyl ethers on short-chain alcohols, monoglycidyl ethers on long-chain alcohols, and the like.

Examples of useful non-functionalized materials include petroleum ethers, synthetic hydrocarbon oils, ester diluents, and the like.

EXAMPLE 18 AND COMPARATIVE EXAMPLES O–Q

Following the procedure described in Example 2 and Comparative Examples A–C above, the compositions of Examples 18 and Comparative Examples O–Q were prepared, cured and evaluated as indicated in Table XV below.

Table XV also describes the properties of the compositions of Example 18 and Comparative Examples O–Q.

TABLE XV

| Examples | O | P | Q | 18 |
|---|---|---|---|---|
| Type | Urethane | Maleated | Epoxy | Hydroxy/Epoxy |
| Polymer | | | | |
| Hydroxy Poly Butadiene[1] | X | X | — | X |
| Maleate Poly Butadiene[2] | — | X | — | — |
| Epoxy EP Polymer[3] | — | — | X | — |
| Curative Catalyst | | | | |
| Isocyanate | X | — | — | — |
| Amine | — | X | — | — |
| Multi-functional Epoxy | — | — | — | X |
| Lewis Acid Catalyst[3] | — | — | X | X |
| Properties | | | | |
| Clarity | Clear | Clear | Opaque | Clear |
| Mixing Determined By: | Time | Time | Color | Color |
| Re-Entry | Difficult | Difficult | Easy | Easy |
| Adhesion, lbs† | 2–4 | 1.5 | 2.8 | 4.5 |

†Adhesion to conductor wire coated with an extended thermoplastic rubber cable filler grease. Force, in lbs., required to pull 114 millimeters (4.5 inches) in length of coated conductor out of encapsulant at 60° C. after curing at room temperature.
[1]Average for typical urethanes such as Caschem 126 and 3M Gella 4441.
[2]3M High Gel 4442.
[3]Trilene TE-141 (Uniroyal Chemical Company).

Example 18 and Comparative Examples O–Q demonstrate the advantages of the present invention over other known commercially-available encapsulant materials, including urethanes, such as Caschem 126 and Gella 4441 (3M Company, Chemical Division, St. Paul, Minn.), and maleated compositions such as High Gel 4442 (3M). Commercially available epoxy encapsulant materials include Trilene TE-141 (Uniroyal Chemical).

Several properties, such as clarity, re-entry, and adhesion were measured and tabulated in Table XV.

Compared to a urethane composition of Comparative Example N, the composition of Example 18 was easier to mix, was easier to re-enter, adhered better to grease-coated wire, and contained no isocyanates.

Compared with the maleated polybutadiene formulation Comparative Example O, the composition of Example 18 was easier to mix, was easier to re-enter, and adhered better to grease-coated wire.

Compared with the epoxidized liquid ethylene/propylene composition of Comparative Example P, the composition of Example 18 possessed better clarity and adhered better to grease-coated wire.

What is claimed is:

1. A method for encapsulating a segment of a signal transmission device which comprises contacting the segment of the signal transmission device with an effective amount to encapsulate said segment of a room-temperature curable composition comprising:

(1) a hydroxy-functional compound having a molecular weight of greater than 500 and a hydroxy functionality of 2 or more, (2) an 1,2-epoxy-functional compound having an epoxy functionality of 2 or more; and (3) a curative catalyst in an amount effective to crosslink the epoxy and hydroxy components of the respective epoxy-functional and hydroxy-functional compounds.

2. A method as recited in claim 1 wherein the segment of the signal transmission device is a splice, a pressure block, or an end block, in a copper cable or fiber optic cable.

3. A method as recited in claim 1 wherein the hydroxy-functional compound is selected from the group consisting of hydroxy-terminated polybutadiene, hydroxy-terminated polybutadiene-styrene, hydroxy-terminated polybutadiene-acrylonitrile, hydroxy-functionalized ethylene-propylene copolymers or terpolymers, castor oils, hydroxy-functionalized polyisoprene, polyester polyols, polyether polyols, and combinations thereof.

4. A method as recited in claim 1 wherein the epoxy-functional compound is selected from the group consisting of an epoxidized olefinically unsaturated natural oil, an aromatic glycidyl ether, an aliphatic glycidyl ether, an epoxidized olefinically unsaturated polymer, an glycidyl ether functional polymer, and combinations thereof.

5. A method as recited in claim 4 wherein the epoxy-functional compound is selected from the group consisting of an epoxidized soybean oil, an epoxidized linseed oil, a diglycidyl ether of bisphenol A, a diglycidyl ether of 1,4-butanediol, an epoxidized polybutadiene polymer, an epoxidized ethylene-propylene polymer, and combinations thereof.

6. A method as recited in claim 1 wherein the curative catalyst comprises a Lewis acid.

7. A method as recited in claim 6 wherein the Lewis acid is selected from the group consisting of boron trifluoride, tin tetrachloride, aluminum trichloride, aluminum tribromide, zinc chloride, silicon tetrachloride, or ferric chloride.

8. A method as recited in claim 1 wherein the curative catalyst is a catalyst composition which comprises:

(1) a catalytically effective amount of a Lewis acid; and (2) a titanate having the structure $Ti(OR^1)(OR^2)(OR^3)(OR^4)$ wherein $R^1$, $R^2$, $R^3$ and $R^4$ are each independently alkyl or aryl.

9. A method as recited in claim 8 wherein the Lewis acid is selected from the group consisting of boron trifluoride, tin tetrachloride, aluminum trichloride, aluminum tribromide, zinc chloride, silicon tetrachloride, and ferric chloride.

10. A method as recited in claim 8 wherein the titanate is selected from the group consisting of tetraisopropyl titanate, tetra-n-butyl titanate, tetraisobutyl titanate, tetra-t-butyl titanate, tetra-2-ethylhexyl titanate, tetradodecylphenoxy titanate, tetranonylphenoxy titanate, and diisopropyl dinonylphenoxy titanate.

* * * * *